United States Patent [19]

Quadri et al.

[11] Patent Number: 5,106,829
[45] Date of Patent: Apr. 21, 1992

[54] METHOD OF MAKING SUBSTANTIALLY SINGLE PHASE SUPERCONDUCTING OXIDE CERAMICS HAVING A TC ABOVE 85 DEGREES

[75] Inventors: Syed B. Quadri, Alexandria, Va.; Louis E. Toth, Washington, D.C.; Michael S. Osofsky, College Park; Steven H. Lawrence, Fort Washington, both of Md.; Donald U. Gubser, Fairfax, Va.; Stuart A. Wolf, Bowie, Md.

[73] Assignee: The United States of America as represented by the Secretary of the Navy, Washington, D.C.

[21] Appl. No.: 587,466

[22] Filed: Sep. 19, 1990

Related U.S. Application Data

[60] Continuation of Ser. No. 292,067, Dec. 30, 1988, abandoned, which is a division of Ser. No. 158,483, Feb. 22, 1988, abandoned.

[51] Int. Cl.$^5$ .............................................. H01B 12/00
[52] U.S. Cl. ..................................... 505/1; 505/779; 505/780; 212/521
[58] Field of Search ................. 505/1, 779, 780; 252/521

[56] References Cited

U.S. PATENT DOCUMENTS 4,992,415  2/1991  Ashok et al. ............................ 505/1

OTHER PUBLICATIONS

Melling, "Powder Preparation & Thermal Properties of 1-2-3 Y BaCu Oxide . . . ", Int. Crygenic Mat'ls Conf., Jun. 14-18, 1987, pp. 1-8.
Cava, "Bulk Superconductivity at 91K in Single-Phase Oxy . . . ", Phys. Rev. Lett., vol. 58, No. 16, Apr. 20, 1987.
Blendell, "Relationship of Electrical, Magnetic, and Mechanical . . . ", ACS Symposium Series: Chem of High Tc Super., Sep. 1987, pp. 240-260.
Amarakoon, "Synthesis, Characterization and Fabrication . . . ", Adv. Ceramic. Mat'l, vol. 2, No. 3B Special Issue, Jul. 1987, pp. 539-555.
Kumakura, "Large Magnetization in YBa$_2$Cu$_3$O$_7$ Prepared by Sintering . . . ", Jap. Jnl. of Appl. Phys. Lett., vol. 27, No. 2, Feb. 1988, pp. L188-L190.
Yao, "Superconductivity in Pseudo-Quaternary System", Mat. Res. Soc. Symp. Proc., vol. 99, Dec. 1987, pp. 543-547.
Hsieh, "Critical Temperature and Critical Current in Phases-Mixed . . . ", Mat. Res. Soc. Symp. Proc., vol. 99, Dec. 1987, pp. 251-254.
Matacotta, "Determination of the Oxygen Content in Samples . . . ", Mat. Res. Soc. Symp. Proc., vol. 99, Dec. 1987, pp. 561-565.
Karpinski, "Equilibrium Pressures of Oxygen Above YBa$_2$Cu$_3$O . . . ", Nature, vol. 331, Jan. 21, 1988.
Noto, "High Field Properties of Superconducting Y$_x$Ba$_{1-x}$Cu Oxide . . .", Jap. Jnl. of Appl. Phys., vol. 26, No. 5, May 1987, pp. L802-L803.

Primary Examiner—Paul Lieberman
Assistant Examiner—Bradley A. Swope
Attorney, Agent, or Firm—Thomas E. McDonnell; Barry A. Edelberg

[57] ABSTRACT

A substantially single phase superconducting composition is formed from a of 1:2:3 molar ratio of fine powders of a superconducting rare earth oxide, CuO, and BaCo$_3$. The mixed powders and shaped articles formed from the mixed powders are calcined, sintered, and cooled in an oxygen containing atmosphere. The cooling step is done slowly to convert the sample to the orthorhombic structure and to improve the superconducting properties. The article formed is a substantially single phase superconducting composition.

24 Claims, 1 Drawing Sheet

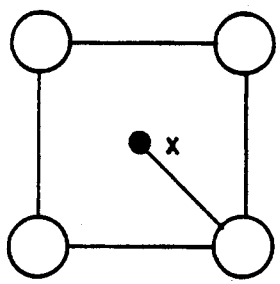
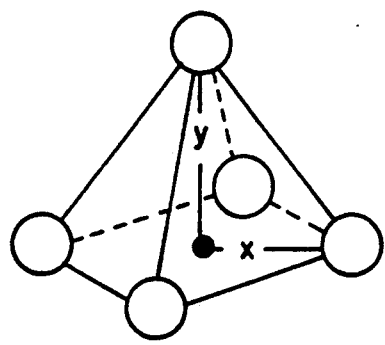
FIG. 1a    FIG. 1b
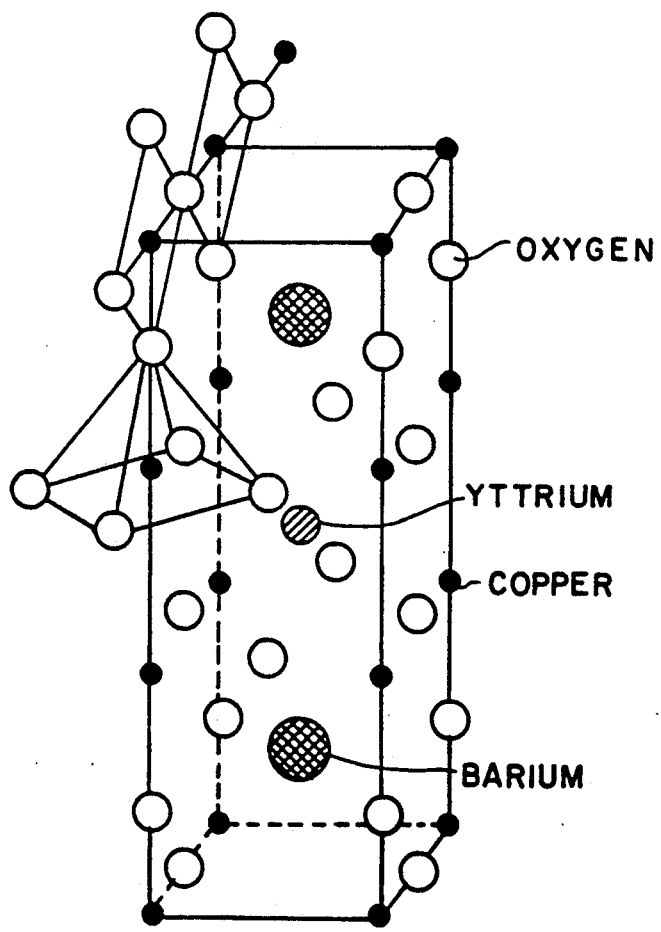
FIG. 2

METHOD OF MAKING SUBSTANTIALLY SINGLE PHASE SUPERCONDUCTING OXIDE CERAMICS HAVING A TC ABOVE 85 DEGREES

This is a continuation of application Ser. No. 07/292,067, filed on Dec. 30, 1988 now abandoned, which is a division of co-pending application Ser. No. 07/158,483 filed on Feb. 22, 1988 now abandoned.

BACKGROUND OF THE INVENTION

1. Field of the Invention

This invention relates to a substantially single phase superconducting composition and to a method of preparing substantially single phase superconducting compositions.

2. Description of the Prior Art

The phenomena of superconductivity was first observed and reported in mercury below 4° K and named by Onnes, Leiden Comm. 124C (1911). This evoked interest in discovering new materials with higher superconducting transition temperature (Tc). Initial research for superconductivity was directed at surveying elements and simple alloys to determine their superconducting properties. F. London, in J. of Chem and Physics 5 (1937), was first to speculate that supercurrents might exist in non-metal systems such as aromatic organic molecules.

During the 1950's, superconductivity research explored two principal themes: (1) development of a microscopic theory, and (2) development of empirical rules to guide the search for new superconducting materials. The first theme is exemplified by the Barden, Cooper, Schrieffer Theory of Superconductivity, Phys. Rev. 106, 162 (1957) and Phys. Rev. 108, 1175 (1957).

The second theme included development of such empirical rules as the electron per/atom, e/z ratio described by B. T. Mathias, Phys. Rev. 97 74 (1955); inverse correlations with Debye temperatures presented by J. DeLauney and R. Dolecklk, Phys. Rev. 72 141 (1947; direct correlations with specific heat noted by H. W. Lewis, Phys. Rev. 101, 93 (1956); and symmetry preferences (cubic symmetry favored over lower symmetry structures) discussed by B. T. Mathias, T. H. Geballe and V. B. Compton, Reviews of Modern Phys. 35, 1 (1963).

The decade of the 1960's extending into the 1970's saw rapid advances in superconductivity research with the potential for practical application being realized with the discovery of the Josephson effect reported in Phys. Lett. 1, 251 (1962), and the further exploration of unusual systems. In the 60's, researchers applied empirical rules and only explored the standard classes of metallic alloys and compounds.

A significant advance on the road to high Tc materials occurred in 1972 when B. T. Mathias et al. reported in Science 175, 1465 (1972) superconductivity in the composition Pb $Mo_6S_8$. This composition is a ternary superconductor This discovery was followed in the late 70's and early 80's by the discovery of superconductivity in "heavy Fermion" systems, Steglich et al., Phys. Rev. Lett. 43, 1892, (1979) and in nearly magnetic systems, Ott et al. Phys. Rev. Lett. 50, 1595 (1983).

The possibility of superconductivity in semiconductor type materials was first predicted by Cohen, Phys. Rev. 134, A511 (1964). Shortly thereafter, Schooley et al. Phys. Rev. Lett 14, 305 (1965) reported discovery of superconductivity in $SrTiO_3$. This was the first perovskite superconducting material.

In 1973, Johnston discovered superconductivity in $LiTiO_3$ at temperatures as high as 13K, Mat. Res. Bull. 8, 777 (1973). This was followed by a report of superconductivity at 14K in $PbBiBaO_3$, Sleight et al. Sol. State Comm. 17, 27 (1975). The $PbBiBaO_3$ composition shows potential application as a sensor of electromagnetic radiation.

The discovery by Bednorz and Muller of a new class of superconducting materials in the lanthanum-barium (strontium)-copper oxide system with $T_c$ above 30K renewed interest in the field by a great number of workers. Phys. B, 64, 189 (1986). Report of Bednorz and Muller's work was followed by the report of Wu and Chu on a material in the Y-Ba-Cu-O system with a Tc above 90K, Phys. Rev. Lett. 58, 908 (1987).

Analysis of x-ray diffraction data suggested the presence of at least three phases in the Wu et al. composition. The active phase is now known to be $YBa_2Cu_3O_7$ Cava et al., Phys. Rev. Lett. 58, 1676 (1987), Rhyne et al., Phys. Rev. B 36, 2294 (1987).

As superconducting compositions with higher Tc's are devised the well known practical applications of superconducting materials such as described in "Superconducting Machines and Services," edited by Foner and Schwartz, Nato Advanced Study Institute, Plenum, 1973, come closer to reality.

SUMMARY OF THE INVENTION

Accordingly, it is an object of this invention to provide a single phase superconducting composition having a transition temperature above 85K. It is a further object of this invention to provide a simple means of identifying the superconducting phase of a superconducting composition. In addition, it is an object of this invention to provide a method for producing a substantially single phase superconducting ceramic composition having a Tc above 85K.

Those and other objects of this invention are accomplished by forming a substantially single phase superconducting ceramic composition having a Tc above 85K. by calcining a superconducting rare earth oxide, copper oxide and barium carbonate to form a uniform mixture of powders, sintering the resultant mixture and slowly cooling the sintered composition to form a substantially orthorhombic superconductor.

BRIEF DESCRIPTION OF THE DRAWINGS

A more complete appreciation of the invention will be readily understood by reference to the Description of the Preferred Embodiments and the accompanying drawings, wherein FIGS. 1a and 1b are representations of the coordination Polyhedra of copper and oxygen atoms in the high temperature superconductor.

FIG. 2 is a representation of the crystal structure of the superconducting composition.

DESCRIPTION OF THE PREFERRED EMBODIMENT

The general formula for the superconductors of this invention is $ABa_2Cu_3O_7$. "A" is anyone of the rare earth elements which is recognized as superconducting. These include Yttrium (Y), Lutetium (Lu), Neodynium (Nd), Samarium (Sm), Europium (Eu), Gadolinium (Gd), Erbium (Er), Holmium (Ho), Ytterbium (Yb). For the purposes of distinguishing these rare earth elements from the remaining rare earth elements, we shall refer to them generically as the superconducting rare earth elements.

A feature of the crystal chemistry of these compounds is the occurrence of a small number of Cu-O coordination polyhedra. These are the same polyhedra that are found in Cu-O compounds in which copper has a +2 valence.

In this crystal structure, illustrated in FIG. 1, copper is located in one of two configurations: (1) at the center of a square array of coplanar oxygen atoms (square planar) (FIG. 1a) and (2) at the center of the square base of a pyramid with oxygen at the vertices, (pyramidal (4+1)) (FIG. 1b). In the square planar configuration, the Cu-O spacing is about 1.95A. In the pyramidal configuration, there are four surrounding oxygen at short distances (1.95A) comparable to those found in the square planar configuration, and one or two oxygens at significantly longer distances (2.3A). The notation (4+1) is used to denote the fact that four of the Cu-O distances are short and one is longer.

Table I lists the coordination of oxygen about the central copper atom in the high $T_c$ ceramic superconductors and it lists typical Cu-O distance In the crystal structures, the coordination polyhedra are arranged so that the square planar configurations are perpendicular to the c-axis of the unit cell and the long axis of the pyramids and octahedra are parallel to it.

Within planes of Cu-O atoms, which are perpendicular to the unit cell's c axis, the typical distance is 1.95A. Parallel to the c axis, the Cu-O distances are either shorter or longer Thus all structures can be viewed as having parallel planes of Cu-O sheets in which the Cu-O spacing is 1.95A.

The rare earth and oxygen atoms are also arranged in planes perpendicular to the c-axis. In the preferred composition $ABa_2Cu_3O_7$, there is a square planar ribbon at the basal planes of the unit cell which is parallel to the c axis and in which the Cu-O distance is only 1.85A. The longest distance in this structure is also parallel to the c axis and is about 2.3A, existing in both the distorted octahedra and 4+1 pyramidal structure.

FIG. 2 illustrates the crystal structure of the superconducting material showing some elements of the Cu-O coordination polyhedra.

TABLE I

| Comparison of Coordination Polyhedra for Cu—O in Superconducting Ceramic Oxide Phases | | |
|---|---|---|
| $YBa_2Cu_3O_{6.5+}$ | square planar | $Cu_1$-$O_1$ (×4) 1.85 |
| | | $Cu_1$-$O_4$ (×4) 1.94 |
| | | $Cu_2$-$2_1$ (×2) 1.94 |
| | | $Cu_3$-$3_1$ (×2) 1.96 |
| | | $Cu_3$-$O_1$ (×2) 2.3 |

The superconducting and electronic transport properties of these materials are very sensitive to their oxygen content, thus it is important to understand where oxygen is added or subtracted in the unit cell. Table II lists positions where oxygen is added and its effect on $T_c$. For the preferred composition $YBa_2Cu_3O_x$, oxygen is added or subtracted from basal planes in the 0, ½, and ½, 0, 0 positions. Also, oxygen can be ordered on the 0, ½, 0 sites leaving the ½, 0, 0 site vacant. This results in an orthorhombic distortion with b/a=1.7%, a unique one dimensional character to the structure and excellent superconducting properties.

If simple valences are considered, the addition of oxygen has the effect of raising a portion of the cations to a higher valence state, or more likely, hybridizing Cu-O bonds producing metallic hole-type conduction. It is convenient, however, to refer to these materials as if they have some $Cu^{+3}$, even though in a formal sense this ion may not exist.

TABLE II

| Location of Oxygen Atoms and Effects on Superconductivity | | |
|---|---|---|
| $ABa_2Cu_3O_{6.5+}$ | vacant site 0 ½ 0 | perfects square planar sites, increases $Cu^{+3/+2}$ orthorhombic distortion, raises $T_c$, 55 to 90K |

All these materials can be produced in the same general manner. Powders of the superconducting rare earth oxide ($M_2O_3$), with M=Y,Lu,Nd,Sm,Ev,Gd,Er,Ho,Yb, copper oxide (CuO), and barium carbonate, are used as starting materials. Barium carbonate and rare earth oxides can be used in their as-received condition, but it is preferred to further mill the starting materials, particularly CuO, to break up coarse particles.

In addition, the powders should be predried to remove any adsorbed moisture prior to weighing. When drying, care should be taken to avoid agglomerate formation. To form the compositions of this invention, all materials are used in a fine powder form having a particle size approximately between 1-10 microns, The materials are mixed to form a uniformly dispersed mixture of powders. The weighed powders in the stoichiometric ratio 1:2:3 are then thoroughly mixed in a mill or mortar and pestle.

Once ground or milled, the mixture of weighed powders are calcined in open, flat crucibles. The mixture is calcined at a predetermined or selected temperature of about 900° C. to about 950° C. for a period of time sufficient to calcine substantially the entire mixture. The calcining takes place in an environment containing oxygen. The oxygen is present at least to the same extent oxygen is present in ambient air. Alternately, the process is conducted in a pure oxygen atmosphere. The calcining and subsequent sintering, and cooling steps can occur at ambient or elevate pressure. For convenience, ambient pressure is preferred.

The particle size of the powder mixture is kept small (1-10 microns). This is done by periodically breaking up agglomerates formed during calcination and regrinding the powder.

In the calcining step, carbonates are decomposed to the oxides and $CO_2$, and a multicomponent oxide is formed, such as

$$\tfrac{1}{2} Y_2O_3 + 2\ BaCO_3 + 3CuO \rightarrow YBa_2Cu_3O_{6.5} + 2CO_2$$

The above reaction assumes no addition or depletion of oxygen from the ambient during the calcining step, an assumption not always valid. The powders are not pelletized prior to calcining largely due to a large molar volume change (−30%) between reactants and products.

One problem in calcining is that the carbonates remain stable and do not always decompose. Furthermore, at the reaction temperatures, particle sintering and grain growth occur. Thus, the calcined materials must be remilled. By monitoring the calcining step with x-ray diffraction, we found that 3-4 hr at 900°-950° C. is a preferred time for calcining, provided all starting powders are 10μ or less.

Once calcining is complete, the major molar volume changes have taken place and the milled powders can be shaped for sintering. The fine particle size powder is formed into shapes or shaped articles such as by pressing the powder into a disk or tablet. The shaped article should be substantially free of large voids.

A multiple of traditional ceramic processing steps can be used to form the shaped article such as cold-pressing, with or without a binder, isostatic pressing, hot-pressing, mixing with binders and extruding into sheets, tubes, etc. The powders can be consolidated by plasma and flame spraying or any of the other well known techniques.

When formed, the shape is sintered in an oxygen containing environment at a preselected temperature of about 900° C. to about 950° C. for a time period sufficient to form a substantially single phase composition. This step is aided by a fine powder size (1-10 microns) and a uniform dispersion of powders (no large voids). Typically 6-12 hours at 900°-950° C. will sinter the particles to 80% density. Longer or shorter times can be used as needed.

After sintering the shaped article is cooled slowly in an oxygen containing atmosphere. The slow cooling can take place stepwise, such as by lowering the temperature 200° to 400° at a time, such as from 900° C. to 500° C. for a period of time such as 2-24 hours, preferably 2-4 hours most preferably 4 hours, and then lowering it again by 200° to 400° for a similar period of time, alternately, the shape can be cooled by a slow graded steady drop in temperature, such as a decrease of 1° C. per minute. Once the temperature of the shaped body drops below 300° C., the shaped body may be removed from the oven and cooled more rapidly to ambient conditions. The shaped body formed is a substantially superconducting oxide ceramic having a Tc above 85° K with strong x-ray diffraction lines at $2\theta = 32.575°$ and 32.875°.

The final step in processing high $T_c$ ceramic superconductors is critical for good properties. The sintered samples must be slowly cooled in flowing $O_2$ and held at some lower temperature to increase the oxygen content of the compound. For example,

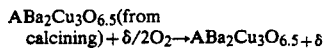

$ABa_2Cu_3O_{6.5}(\text{from calcining}) + \delta/2O_2 \rightarrow ABa_2Cu_3O_{6.5+\delta}$ The effect of this step on superconductivity can be dramatic. For $ABa_2Cu_3O_7$, the fully oxygenated samples show large volume magnetic flux expulsion and R=0 at temperatures in excess of 85K. Without the additional oxygen, the transitions are broad and the flux expulsion only partial.

For this invention the composition ranges of intercalation of oxygen are $ABa_2Cu_3O_{6.5+\delta}$ with $\delta$ being 0-0.5. The highest values of are obtained with long term anneals (slow cooling) at about 500° C. under one atom of oxygen; lower values of $\delta$ are obtained with lower partial pressures.

EXAMPLE $YBa_2Cu_3O_x$: Processing this compound follows the general procedure outline above. At temperatures above 700° C., $YBa_2Cu_3O_x$ has a tetragonal structure. Its oxygen content is believed to be $YBa_2Cu_3O_x$. Below 700° C., the unit cell is orthorhombic and the composition adjusts towards $YBa_2Cu_3O_{7.0}$.

The critical step in processing is to add this 0.5 oxygen atom per unit cell. This is critical because these oxygen atoms and their proper ordering on 0, ½, 0 sites dramatically improves superconducting properties. In such samples, $T_c$ onsets above 85K, the transition widths of 1K, and large volume magnetic flux expulsion are observed, i.e. the sample levitates in a strong magnetic field.

The presence of the ordered intercalated oxygen atoms causes a distinct orthorhombic distortion in the unit cell of about 1.7%. Its presence can be readily observed from a splitting or shouldering the main x-ray diffraction peak at 32°-33°. Normally, the extra oxygen can enter during slow cooling from 900° C. in flowing oxygen, preferably at a rate of 1°/min. In some instances, furnace cooling is sufficient. Alternatively, one can anneal the sample in a step wise temperature decrease with a hold at about 500°-600° C. for 2 to 5 hours.

The individual grains of samples with a pronounced orthorhombic distortion show striations or bands when viewed in an electron microscope. This is believed to be due to domain formation. In one band, the "b" axis of the unit cell is oriented 90° to the "b" axis of the adjacent band. Electron microscopy also shows that small deviations from stoichiometry result in an amorphous second phase forming in the grain boundaries. Because most of the phases in equilibrium with $YBa_2Cu_3O_7$ are insulators, a grain boundary phase is probably an insulator.

We have measured a large number of superconducting properties on well characterized $YBa_2Cu_3O_7$ with a 1.7% orthorhombic distortion. These are listed in Table III.

TABLE III

| Physical and Superconducting Properties of $YBa_2Cu_3O_7$ (NRL Samples) | |
| --- | --- |
| Lattice Parameters (Å) | |
| a | 3.822 + 0.002 |
| b | 3.888 + 0.002 |
| c | 11.672 + 0.005 |
| Volume (Å³) | 173.4 |
| % Distortion | 1.7 |
| Oxygens per unit cell | 6.94 |
| $T_c$ onset (K) | 93 |
| R = O (K) | 91 |
| % flux expulsion | 100 |
| (94K) (μr-cm) | 200 |
| $(dH_c/dT)_{Tc}$ (kG/K | 22-36* |
| $H_{c1}$ (4.2K) (kG) | 1470-2370* |
| $H_{c1}$ (4.2K) (kG) | 0.8 |
| $H_c$ (0) (kG) | 20-26* |
| $J_c$ (4K) (A/cm²) | $10^{5+}$ |

*Calculated from critical field measurements
+Estimated from magnetization studies As noted, the equilibration or cool down phase is more critical to the production of a single phase composition than is stoichiometric proportions of materials. Therefore, it is important to conduct the cool down phase for a sufficient length of time that the crystal structure can fully develop. The cool down should occur at least over 2 hours and preferably between 2 and 4 hours. In a step wise cooling process, it is preferred to hold each temperature plateau for at least 2 to 4 hours and most preferably 4 hours. The most preferred cooling method is a 1° per minute temperature reduction for a period not less than 2 hours. When the temperature is reduced to 300° C., the structure is considered cooled and the structure can be removed from the anealy oven. Treatment in accordance with the cate that the degree of sintering did not affect the crystal symmetry The microstructure of the sample with orthorhombic symmetry showed significant amounts of twinning as evidence by the striations.

TABLE IV

COMPOSITION, HEAT TREATMENTS, LATTICE PARAMETERS, AND TRANSITION TEMPERATURES FOR Y—Ba—Cu-OXIDES

| Sample No. | Nominal Composition | Heat Treatment* | a(A) | b(A) | c(A) | vol (A$^3$) | % Distortion | $T_c$(K) | $\Delta T_c^{++}$(K) |
|---|---|---|---|---|---|---|---|---|---|
| 194 | $Y_{0.1}Ba_{0.4}Cu_{0.5}O_y$ | A | 3.876 ± 0.006 | 3.877 ± 0.005 | 11.634 ± 0.013 | 174.8 | 0.02 | 93 | 40 |
| 186D | $T_{0.28}Ba_{0.32}Cu_{0.4}O_y$ | B | 3.867 ± 0.013 | 3.872 ± 0.012 | 11.633 ± 0.030 | 174.2 | 0.14 | 85 | 30 |
| 193A | $Y_{0.2}Ba_{0.3}Cu_{0.5}O_y$ | A | 3.863 ± 0.014 | 3.873 ± 0.011 | 11.626 ± 0.027 | 173.9 | 0.25 | 65 | >30 |
| 223.3 | $YBa_2Cu_3O_7$ | C | 3.834 ± 0.007 | 3.884 ± 0.007 | 11.70 ± 0.02 | 174.2 | 1.3 | 85 | 40 |
| 177 | $Y_{0.3}Ba_{0.3}Cu_{0.4}O_y$ | D | 3.835 ± 0.007 | 3.890 ± 0.008 | 11.680 ± 0.019 | 174.3 | 1.4 | 93 | 33 |
| 183 | $Y_{0.3}Ba_{0.2}Cu_{0.5}O_y$ | D | 3.826 ± 0.013 | 3.879 ± 0.011 | 11.739 ± 0.031 | 174.2 | 1.4 | 80 | 25 |
| 223.3 | $YBa_2Cu_3O_7{}^+$ | E | 3.8220 ± 0.0001 | 3.8855 ± 0.0001 | 11.6797 ± 0.0004 | 173.4 | 1.6 | 93 | 2 |
| 223.3 | $YBa_2Cu_3O_7$ | E | 3.822 ± 0.002 | 3.888 ± 0.002 | 11.672 ± 0.005 | 173.4 | 1.7 | 93 | 2 |
| 187 | $Y_{0.24}Ba_{0.36}Cu_{0.4}O_y$ | F | 3.838 ± 0.015 | 3.902 ± 0.024 | 11.755 ± 0.031 | 176.1 | 1.7 | 93 | 2 |
| 242 | $Y_{0.15}Ba_{0.3}Cu_{0.55}O_y$ | E | 3.837 ± 0.024 | 3.911 ± 0.023 | 11.705 ± 0.074 | 175.6 | 1.9 | 93 | 2 |

+Based on neutron diffraction measurements of J. Rhyne et al., to be published
A = Sinter @ 900° C., air quench
B = Sinter @ 1000° C. for 24–96 h; air quench
C = After E, reheat to 1000° C., air quench
D = Sinter @ 950° C., hold @ 700° C. 1 hr
E = Sinter @ 937° C., cool 1°/min
F = Sinter @ 1000° C., hold at 450° C. 24 hr
++$\Delta T_c$ ranges from R-onset to R-O method of this invention favors an orthorhombic crystal structure.

In early tests, most samples were prepared off the stoichiometric 1:2:3 and we observed the orthorhombic and tetragonal symmetries with nearly equal frequency. We saw no obvious correlation between overall composition and the occurrence of either phase. At the stoichiometric composition, we observed only the orthorhombic structure. There is no indication, however, that the tetragonal phase has a stoichiometry other than 1:2:3:.

Table IV shows the lattice parameters of some of the samples. These parameters were calculated assuming the structure to be orthorhombic and carrying out a least squares fit to 15 to 20 high angle diffraction peaks. If the "a" and "b" parameters were determined to be equivalent to within the uncertainty of the fit, we then called the sample tetragonal. For all the samples determined to be orthorhombic, the b/a ratios lie between 1.014 and 1.019. The "a" lattice parameter varies from 3.822 Å and 3.838 Å. The "b" parameter varies from 3.879 Å and 3.911 Å. For nearly tetragonal samples, the orthorhombic distortion ranges from less than measurable to about 0.25%. The "a" lattice parameter varies from 3.863 Å to 3.876 Å and "b" from 3.867 Å to 3.877 Å.

For the samples that we tested, there was no overlap of the b/a ratios between the two groups of samples; i.e. the orthorhombic distortion was 1.4–1.9% in the orthorhombic samples and much smaller, less than 0.3% in the tetragonal samples. The "b" parameter tends to be slightly smaller in the tetragonal structure compared to the orthorhombic, whereas "a" clearly shows the opposite trend. This would indicate at least partial occupancy of both $\frac{1}{2}$,0,0 and 0,$\frac{1}{2}$,0 sites in the tetragonal structure. Thus we regard the tetragonal structure as the disordered form of the orthorhombic lattice.

Three samples were inspected with optical microscopy. Two samples with nearly tetragonal symmetry showed elongated grains. One of the samples with tetragonal symmetry had sintered fairly well with typical elongated grains 10 by 50 microns in size and was much more dense than the other sample. These results indicate that the degree of sintering did not affect the crystal symmetry The microstructure of the sample with orthorhombic symmetry showed significant amounts of twinning as evidence by the striations.

Changing the focal length showed that most of the grains were striated. In some grains the striations are seen running at right angles to each other. It is believed these striations result from twinning associated with the orthorhombic distortion.

We measured the a.c. resistivities and d.c. susceptibilities of the samples. The resistive onsets occurred in excess of 85K in most samples. Slow cooling and/or annealing at about 500° C., in either air or oxygen, sharpens the transitions.

Samples of stoichiometric 1:2:3 compositions and well defined orthorhombic distortions had onsets of 93K and R=0 at 91K. The same samples showed nearly complete flux expulsion. Samples containing the tetragonal phase show far broader transitions and smaller amounts of flux expulsion, 1–12% after correcting for the amounts of the 1:2:3 phase. The sample with the least amount of orthorhombic distortion, sample 194 (Table IV), had the broadest transition: $T_{onset}$=93K and R=0 at 53K. Samples with an orthorhombic distortion of about 1.4% but which were not slow cooled or held at a lower intermediary temperature, had high onsets but broad transition. Only those samples that were slow cooled or held at a lower temperature had transition widths of a few degrees. Slow cooling allows more complete ordering of oxygen atoms on 0,$\frac{1}{2}$,0 sites.

To study the relationship between orthorhombic and tetragonal symmetry, we used a stoichiometric sample, number 223.3, with a well defined orthorhombic distortion of 1.017$_3$. After equilibration at 1000° C., we quenched this sample in air. Quenching produced no measurable change in the b and c axial lengths, but about a 0.3% increase in the length of the a-axis; this corresponds to a smaller orthorhombic distortion with b/a=1.013. The resistive transition degraded considerably. Prior to reheating, the superconducting properties of this sample were $T_{onset}$=93K and R=0 at 91K. After quenching, $T_{onset}$=85K and R=0 at 46K.

A set of nonstoichiometric samples were sintered at 1000° C. in flowing oxygen for 24 to 96 hours assuring that the samples were in equilibrium. Specific samples were then removed every 24 hours by quenching in air. All samples had broad transitions of 30K. These samples all had tetragonal symmetry, suggesting that the tetragonal symmetry is the property of a high temperature phase and that the orthorhombic phase forms at a lower temperature.

The conversion from the orthorhombic to the tetragonal forms of the structure can be caused by a disordering of the oxygen atoms on the basal planes or by removing some of the oxygen atoms from the $0,\frac{1}{2},0$ positions. We believe both occur in samples heated at higher temperatures in air or oxygen. Alternatively, the conversion can occur when samples are heated in a reducing atmosphere. In this case, the progression to a tetragonal structure was studied by neutron diffraction. Oxygen atoms are removed preferentially from the $0,\frac{1}{2},0$ sites. This particular heat treatment produced a semiconducting sample.

We believe the orthorhombic distortion occurs on slow cooling or holding at some lower intermediary temperature when oxygen atoms diffuse from $\frac{1}{2},0,0$ sites to vacant $0,\frac{1}{2},0$ sites and by the addition of oxygen atoms from the ambient atmosphere. It is well established from earlier research that compounds with very closely related structures will incorporate an additional 10–15% more oxygen during a low temperature post anneal.

Although not controlling of our invention, we believe that the superconductivity in this material is very strongly associated with the Cu-O chains in the basal plane and less influenced by the other atoms in the unit cell. Either disordering the chains or breaking them up by removing the oxygen is detrimental to superconductivity.

The orthorhombic phase forms most easily in stoichiometric compositions. Very slow cooling and/or lower temperature post-anneals in oxygen or air promote a well formed orthorhombic distortion. Such samples exhibit striations in their microstructures indication the existence of extensive twinning The presence of the ordered orthorhombic structure is associated with a sharp transition temperature and nearly complete flux expulsion.

Superconductivity is correlated with the ordering of the oxygen atoms on the basal plane producing one dimensional Cu-O chains. High $T_c$ ceramic superconductors have layered crystal structures with Cu-O coordination polyhedra typical of Cu+2. Intercalation of additional oxygen is critical to the superconducting properties.

Obviously, numerous variations of the present invention are possible in light of the above teachings. It is therefore to be understood that within the scope of the appended claims, the invention may be practiced otherwise than as specifically described herein.

What is claimed as new and desired to be secured by Letters Patent of the United States is:

1. A method for producing a substantially single phase superconducting ceramic composition having a $T_c$ above 85K, comprising the steps of:
   (a) mixing stoichiometric quantities of fine particle size powders of a superconducting rare earth oxide, barium carbonate and copper oxide to form an evenly dispersed mixture;
   (b) calcining said mixture at a predetermined temperature of about 900° C. to about 950° C. in an oxygen-containing environment for a period sufficient to calcine substantially the entire mixture;
   (c) maintaining a fine particle size for said mixture during and subsequent to calcination;
   (d) forming said fine particle size calcined mixture into a shape substantially free of voids;
   (e) sintering said shape in an oxygen-containing environment at a predetermined temperature of about 900° C. to about 950° C. for a period of time sufficient to substantially densify said shape;
   (f) cooling said shape over a period of about 2 to 24 hours in an oxygen-containing environment at a rate which is sufficiently slow to form a substantially single phase superconducting composition having an orthorhombic crystal lattice and a $T_c$ greater than 85K.

2. A method according to claim 1 wherein the particle size of said powders is about 1 to 10 microns.

3. A method according to claim 2 wherein said mixture is formed from $Y_2O_y$, $BaCO_3$ and CuO powders.

4. A method according to claim 3 wherein the powders of $Y_2O_3$, $BaCO_3$ and CuO are provided in stoichiometric ratio of 1:2:3.

5. A method according to claim 3 wherein said mixture is calcined for at least 6 hours.

6. A method according to claim 4 wherein said mixture is calcine for at least 6 hours.

7. A method according to claim 5 wherein said shape is sintered for at least 12 hours.

8. A method according to claim 6 wherein said shape is sintered for at least 12 hours.

9. A method according to claim 3 wherein said oxygen containing environment is air at ambient pressure.

10. A method according to claim 3 wherein said oxygen containing environment is substantially pure oxygen at ambient pressure.

11. A method according to claim 3 wherein said oxygen containing environment is substantially pure oxygen at an over pressure above 1 atmosphere.

12. A method according to claim 8 wherein said oxygen containing environment is air at ambient pressure.

13. A method according to claim 8 wherein said oxygen containing environment is substantially pure oxygen at ambient pressure.

14. A method according to claim 8 wherein said oxygen containing environment is substantially pure oxygen at an over pressure above 1 atmosphere.

15. A method according to claim 14 wherein the composition is substantially in the orthorhombic phase.

16. A method according to claim 7 wherein said shape is cooled step wise to 300° C. by 200° to 400° steps and held at each step for periods of 2 to 24 hours.

17. A method according to claim 16 therein the temperature is held for a period of 2 to 4 hours at each step.

18. A method according to claim 16 wherein the temperature is held for 4 hours at each step.

19. A method according to claim 8 wherein said shape is cooled stepwise to 300° C. by 200 to 400 degree steps and held at each step for periods of 2 to 24 hours.

20. A method according to claim 19 wherein the temperature is held for a period of 2 to 4 hours at each step.

21. A method according to claim 20 wherein the temperature is held for 4 hours at each step.

22. A method according to claim 7 wherein said shape is cooled at a rate of 1° C. per minute.

23. A method according to claim 8 wherein said shape is cooled at a rate of 1° C. per minute.

24. The method of claim 1, wherein said sintering densifies said particles to about 80% density.

* * * * *

UNITED STATES PATENT AND TRADEMARK OFFICE
CERTIFICATE OF CORRECTION

PATENT NO. : 5,106,829

DATED : April 21, 1992

INVENTOR(S) : Syed B. Qadri, Louis E. Toth, Michael S. Osofsky, Steven H. Lawrence, Donald U. Gubser and Stuart A. Wolf It is certified that error appears in the above-identified patent and that said Letters Patent is hereby corrected as shown below:

Title page, Item 75, line 1 change "Syed B. Quadri" to --Syed B. Qadri--.

Signed and Sealed this

Twenty-third Day of November, 1993

Attest:

BRUCE LEHMAN

*Attesting Officer*      *Commissioner of Patents and Trademarks*

Adverse Decision In Interference

Patent No. 5,106,829, Syed B. Quadri, Louis E. Toth, Michael S. Osofsky, Steven H. Lawrence, Donald U. Gubser, Stuart A. Wolf, METHOD OF MAKING SUBSTANTIALLY SINGLE PHASE SUPERCONDUCTING OXIDE CERAMICS HAVING A TC ABOVE 85 DEGREES K, Interference No. 103,183, final judgment adverse to the patentees rendered August 22, 2001, as to claims 1-24.
*(Official Gazette December 18, 2001)*